United States Patent
Koga et al.

(10) Patent No.: US 7,332,986 B2
(45) Date of Patent: Feb. 19, 2008

(54) SURFACE ACOUSTIC WAVE APPARATUS AND COMMUNICATIONS EQUIPMENT

(75) Inventors: Wataru Koga, Souraku-gun (JP); Takanori Ikuta, Souraku-gun (JP); Masayuki Funami, Souraku-gun (JP); Kiyohiro Iioka, Souraku-gun (JP)

(73) Assignee: Kyocera Corporation, Kyoto (JP)

( * ) Notice: Subject to any disclaimer, the term of this patent is extended or adjusted under 35 U.S.C. 154(b) by 124 days.

(21) Appl. No.: 11/169,303

(22) Filed: Jun. 28, 2005

(65) Prior Publication Data

US 2005/0285700 A1    Dec. 29, 2005

(30) Foreign Application Priority Data

Jun. 28, 2004  (JP)  ............................ 2004-190460
Jul. 28, 2004   (JP)  ............................ 2004-220058

(51) Int. Cl.
  H03H 9/08   (2006.01)
  H03H 9/64   (2006.01)
  H03H 9/72   (2006.01)
(52) U.S. Cl. .................. 333/193; 333/133; 310/313 B
(58) Field of Classification Search ........ 333/193–196, 333/133; 310/313 R, 313 B, 313 D
  See application file for complete search history.

(56) References Cited

U.S. PATENT DOCUMENTS

| | | | |
|---|---|---|---|
| 6,310,422 B1 * | 10/2001 | Satoh et al. ............. | 310/313 R |
| 6,351,194 B2 * | 2/2002 | Takahashi et al. .......... | 333/133 |
| 6,369,672 B1 | 4/2002 | Ikada | |
| 6,388,545 B1 | 5/2002 | Kawachi et al. | |
| 6,489,860 B1 | 12/2002 | Ohashi | |
| 6,566,981 B2 | 5/2003 | Urabe et al. | |
| 6,922,119 B2 * | 7/2005 | Matsuta et al. ............. | 333/193 |
| 7,053,731 B2 | 5/2006 | Iwamoto et al. | |
| 2003/0060172 A1 * | 3/2003 | Kuriyama et al. ............ | 455/90 |
| 2004/0113215 A1 | 6/2004 | Shimada et al. | |
| 2004/0207485 A1 * | 10/2004 | Kawachi et al. ............ | 333/133 |
| 2005/0264375 A1 * | 12/2005 | Ikuta et al. .................. | 333/133 |

FOREIGN PATENT DOCUMENTS

| JP | 04-293310 | | 10/1992 |
|---|---|---|---|
| JP | 09-135143 | | 5/1997 |
| JP | 2000-196400 A | | 7/2000 |
| JP | 2000-196407 | * | 7/2000 |
| JP | 2000312127 A | | 7/2000 |
| JP | 2001-127589 | | 5/2001 |
| JP | 3430745 | | 5/2003 |
| JP | 2004153579 A | | 5/2004 |
| JP | 2004153580 A | | 5/2004 |
| JP | 2004-235896 A | | 8/2004 |
| JP | 2005-102114 | | 4/2005 |
| JP | 2005-167969 | * | 6/2005 |

* cited by examiner

Primary Examiner—Barbara Summons
(74) Attorney, Agent, or Firm—Hogan & Hartson LLP

(57) ABSTRACT

An IDT electrode 2 and an electrode pad 3 are formed on one principal face of a piezoelectric substrate 1 and a circular electrode 4 is formed so as to surround these components. The circular electrode 4 is connected to a radiating conductor 15 formed on a bottom face of a circuit board 11 through a via conductor 14 formed within the circuit board 11. Thus, since heat generated in the IDT electrode 2 is easy to be released to the outside through the circular electrode 4, the via conductor 14 and the radiating conductor 15, adverse effects due to the heat can be prevented, thereby improving high power durability.

15 Claims, 5 Drawing Sheets

SURFACE ACOUSTIC WAVE APPARATUS AND COMMUNICATIONS EQUIPMENT

BACKGROUND OF THE INVENTION

1. Field of the Invention

The present invention relates to a surface acoustic wave (hereinafter referred to as "SAW") apparatus, in particular, an SAW apparatus used for a transmit-receive demultiplexer (duplexer) of a communications equipment requiring miniaturized, high electric power resistance.

2. Description of Related Art

Recently, a SAW filter has been used for various communications equipment.

Since the SAW filter has steep filter characteristics and excellent features such as exceptional mass-production quality, it has been often used for, in particular, mobile communications equipment.

In place of a conventionally used dielectric filter, the SAW filter has also been employed as a filter constituting a duplexer in the mobile communications equipment.

However, since a signal amplified by a power amplifier passes through the duplexer, high electric power of as much as 0.8 to 1.2 W is applied at the time of communication.

When high electric power is applied to an IDT (Inter Digital Transducer) electrode of the SAW filter, a large amount of heat is generated in the IDT electrode and migration of the electrode material is accelerated due to the heat and thus high power durability of the IDT electrode becomes insufficient.

Thus, since high power durability is insufficient in the conventionally used SAW filter, there is a strong demand for the SAW filter having improved high power durability.

For the duplexer, improvement of high power durability and miniaturization has been demanded strongly.

Conventionally, a so-called package-type SAW filter has been used. The package-type SAW filter is produced as follows: an SAW device is mounted on a recessed part of a ceramic package and a pad electrode of the SAW device is connected to a terminal part of the package according to a wire-bonding method, and then the recessed part is hermetically sealed with a cap or the like.

On the contrary, a so-called CSP-type SAW filter has been recently widespread. In the CSP-type SAW filter, the SAW device is flip-chip mounted on a circuit board by actively utilizing CSP (Chip Size Package) technique for miniaturization. In this SAW filter, space and height necessary for wire-bonding in the conventional package-type SAW filter can be reduced.

However, the CSP-type SAW filter has the following problem: Since the face of a piezoelectric substrate on which the IDT electrode is formed is mounted face down on the circuit board, high power is applied and thus it becomes more difficult to radiate heat generated in the IDT electrode. As a result, it is disadvantageous in terms of high power durability.

It is due to the fact that, in the CSP-type SAW filter, heat can be radiated from the face of the piezoelectric substrate on which the SAW device is formed to the circuit board only through conductor bumps with very small cross-sectional areas and thus, it is difficult to ensure effective radiation paths. An object of the present invention is to provide a compact CSP-type SAW filter with excellent high power durability.

SUMMARY OF THE INVENTION

An SAW apparatus of the present invention has a piezoelectric substrate, a filter device including an IDT electrode, and a circuit board for mounting the face of the piezoelectric substrate on which the filter device is formed (hereinafter referred to as "principal face") so as to be opposed to each other, wherein a circular electrode surrounding the filter device is formed on the principal face, a sealing circular conductor connected to the circular electrode is formed on a face of the circuit board on which the piezoelectric substrate is mounted, a radiating conductor is provided on a face on the opposite side of the face of the circuit board on which the piezoelectric substrate is mounted, or an inside layer of the circuit board, and a via conductor which is connected to the sealing circular conductor and passes through the circuit board up to the radiating conductor is provided.

In this SAW apparatus, heat generated in the IDT electrode of the filter device can be spread to the circular electrode formed so as to surround the circular electrode and the heat spread to the circular electrode can be transmitted to the radiating conductor via the via conductor to be released from the radiating conductor.

Accordingly, even in the CSP-type SAW apparatus, heat generated in the IDT electrode of the SAW device can be radiated efficiently. As a result, migration in the IDT electrode can be prevented from occurring, leading to an SAW apparatus with excellent high power durability.

It is desirable that the sealing circular conductor, the via conductor or the radiating conductor is grounded. Since the sealing circular conductor, the via conductor and the radiating conductor are formed so as to surround the filter device, this ground connection brings the effect of electromagnetically shielding the filter device. Thus, interference with other parts and devices located in the communications equipment can be reduced.

With the configuration in which the circular electrode is formed in the shape of a square frame and the via conductor is connected to any side or all sides of the circular electrode, since the IDT electrode can be connected to the circular electrode through the shortest path (a conductor connecting the IDT electrode to the circular electrode is referred to as a "conductor pattern"), heat can be radiated more efficiently.

When a plurality of filter devices are formed on the piezoelectric substrate and circular electrodes are formed so as to surround the plurality of filter devices individually, the circular electrode serves as an electromagnetic shield for each filter. Thus, it is possible to eliminate electromagnetic connection between the filters and also suppress interference between the filters.

The plurality of filter devices are formed of, for example, a transmit filter device and a receive filter device.

Especially, in the case of the transmit filter and receive filter constituting a duplexer, a transmit signal amplified by a power amplifier can leak to the side of reception, and since such leakage interferes a signal that should be received actually, interference between the filters must be avoided. Therefore, when the plurality of filters are the transmit filter and receive filter, this SAW apparatus can be preferably used as the duplexer.

Furthermore, when the plurality of filters are a GSM filter (800 MHz band) and a DCS filter (1.9 GHz band), or the like, this SAW apparatus can be preferably used as it is reduced in size as compared with the SAW apparatus in which two filters are formed on separate piezoelectric substrates, thereby making mounted area to the circuit board smaller.

When the circular electrodes surrounding the filter devices are jointed to each other, in the case where there is a difference in heating value between the plurality of filters, the filter with a larger heating value can radiate heat through both of the circular electrode surrounding itself and the circular electrode surrounding the filter with a smaller heating value. Thus, this SAW apparatus has the configuration with more excellent heat radiating property. Moreover, the SAW apparatus can be miniaturized since the mounted area of the circular electrode can be made smaller as compared with the case where the plurality of circular electrodes are not jointed to each other. Also, in this case, each filter is shielded electromagnetically and interference between the filters is suppressed.

When size of the circular electrodes surrounding the filter devices varies from one filter device to another, since more via conductors can be provided around a filter with a larger heating value by making the circular electrode surrounding the filter with a larger heating value larger, heat can be efficiently released to the circuit board.

When at least one IDT electrode is electrically connected to the circular electrode through a resistor, since heat generated in the IDT electrode can be released to the circular electrode through the resistor while preventing a high-frequency signal of the IDT electrode from releasing, heat can be radiated successfully without exerting an adverse effect on characteristics of the IDT electrode and characteristics of the filter comprised of the IDT electrode.

When the reflector is disposed at each side of the IDT electrode in the direction of propagating surface acoustic wave and the reflectors are connected to the circular electrode, since the path for radiating heat generated in the IDT electrode by receiving input of a high power signal can be ensured as the reflectors disposed at each side of the IDT electrode in the direction of propagating SAW as well as the connection part such as conductor bump, temperature of the SAW device can be lowered more efficiently as compared with the conventional SAW apparatus that radiates heat from only through the connection part.

Thus, temperature of the IDT electrode can be prevented from becoming high, the frequency characteristic of the SAW device does not vary greatly depending on change in temperature. Therefore, the SAW apparatus of the present invention has excellent high power durability, stable frequency characteristic and high reliability.

With the above-mentioned configuration, when the sealing circular conductor is a ground electrode, the reflectors are connected to the ground electrode and thus reflective efficiency of SAW is increased. Accordingly, when the SAW device is used as the filter, attenuation outside the passband can be increased.

A communications equipment of the present invention is equipped with the SAW apparatus with the above-mentioned configuration and has at least either of a receive circuit or a transmit circuit. Even when a high power signal is used, desired filter characteristics can be obtained with high reliability by using the compact and reliable SAW device.

The above-mentioned or other advantages, features and effects of the present invention will be clearly understood by reading the following description of preferred embodiments with reference to appended figures.

DETAILED DESCRIPTION OF PREFERRED EMBODIMENTS

Hereinafter, a surface acoustic wave (SAW) apparatus of the present invention will be described in detail with reference to schematic figures.

Figure 1:
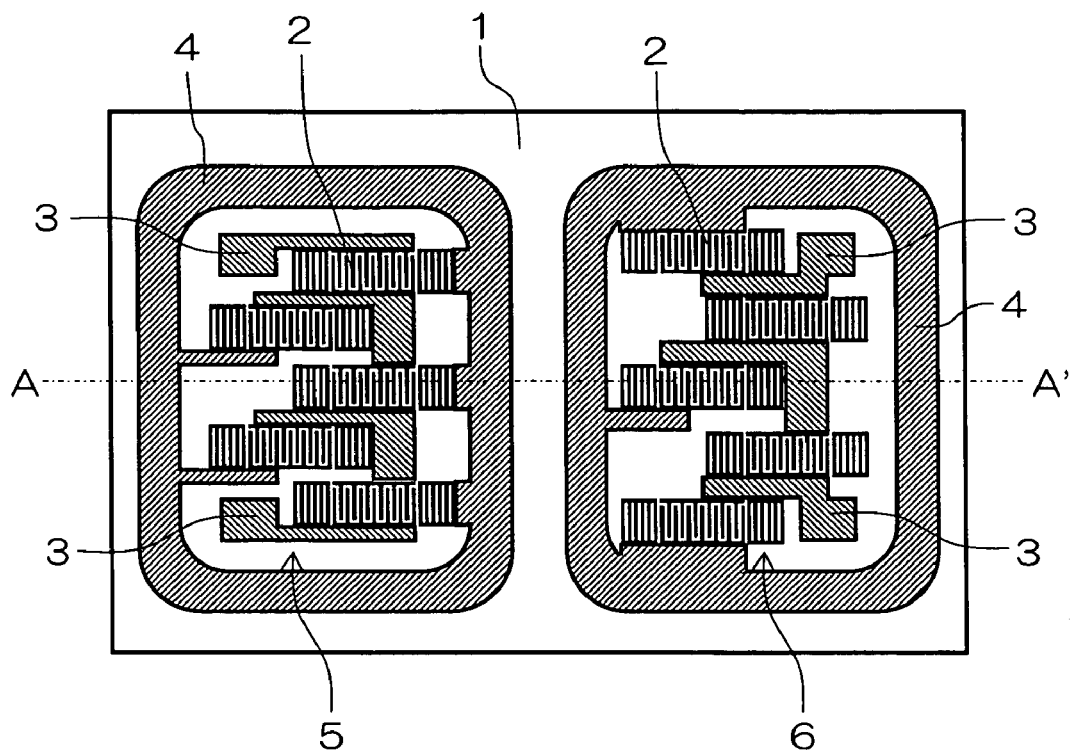
FIG. 1 is a plan view showing a principal face of a piezoelectric substrate constituting a SAW apparatus of the present invention.
Figure 2:
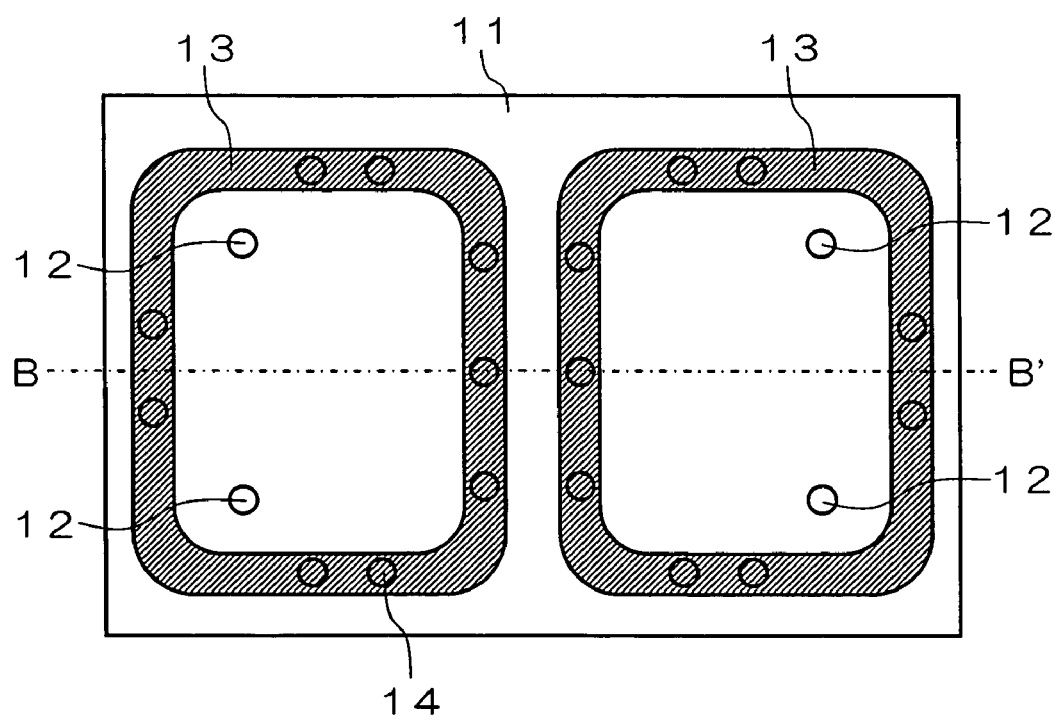
FIG. 2 is a plan view showing a top face of a circuit board on which the piezoelectric substrate is mounted.
Figure 3:
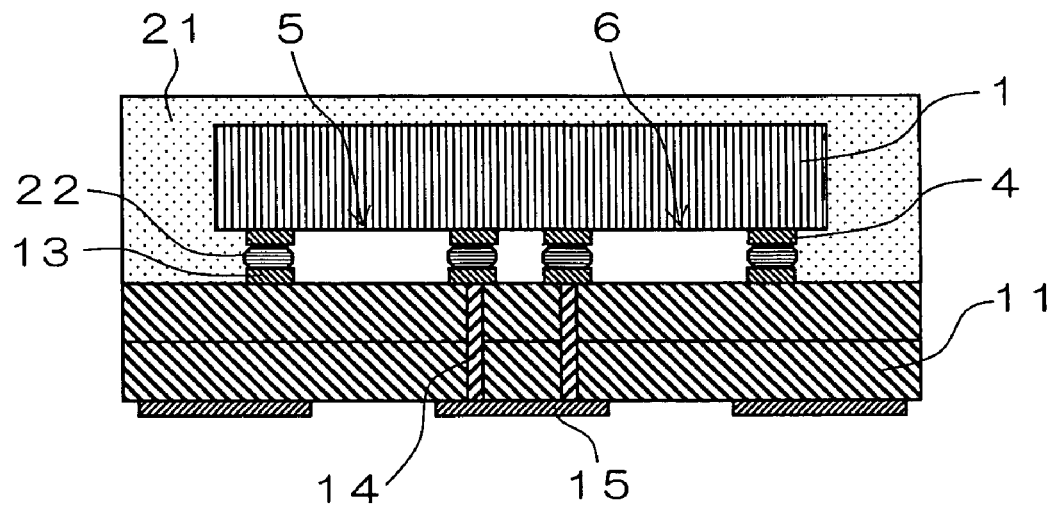
FIG. 3 is a sectional view showing the SAW apparatus of the present invention taken substantially along a line A-A' of FIG. 1 and a line B-B' of FIG. 2.

FIG. 1 is a plan view showing a principal face of a piezoelectric substrate of an SAW device and FIG. 2 is a plan view showing a top face of a circuit board on which the piezoelectric substrate is mounted. FIG. 3 is a sectional view of the SAW apparatus of the present invention in which the SAW device is mounted on the circuit board, taken substantially along a line A-A' of FIG. 1 and a line B-B' of FIG. 2.

In this embodiment, a duplexer formed from two ladder-type SAW devices is shown as an example.

In the SAW apparatus, the SAW devices are mounted on the circuit board 11 so that a face of a piezoelectric substrate on which IDT electrodes as exciting electrodes for generating SAW are formed (hereinafter referred to as "principal face") is opposed to the top face of the circuit board 11.

FIG. 1 shows the piezoelectric substrate 1, IDT electrodes 2 formed on the principal face of the piezoelectric substrate 1, and electrode pads 3 that are electrically connected to the IDT electrodes 2 and function as input/output terminals. A reference numeral 4 denotes circular electrodes formed so as to surround the plurality of IDT electrodes 2 and the plurality of electrode pads 3. The components constitute the SAW devices.

Two SAW devices each constitute a transmit filter 5 and receive filter 6. The circular electrodes 4 each surround the transmit filter 5 and the receive filter 6, respectively. In this embodiment, each of the circular electrodes 4 is formed in the shape of a square frame. The IDT electrodes 2 constituting the transmit filter 5 receiving high electric power and generate heat during operation.

The IDT electrodes 2 and the like other than the input/output electrode pads 3 and circular electrodes 4 may be covered by a protective film (not shown). In this case, the protective film is provided to prevent oxidation of the IDT electrodes 2 and the like, improve moisture resistance, prevent short-circuit between the electrodes and in each electrode due to adhesion of foreign material or the like, and adjust frequency, and is formed according to a thin-film formation method such as a CVD method or evaporation method after these electrodes are formed. An $SiO_2$ film, $Si_3N_4$ film or Si film is used as the protective film.

FIG. 2 shows the circuit substrate 11, via conductors 12 formed on the circuit board 11 that correspond to the electrode pads 3, sealing circular conductors 13 formed on the top face of the circuit board 11 that correspond to the circular electrodes 4, via conductors 14 formed within the circuit board 11 that correspond to the circular electrodes 4 and radiating conductors 15 that are formed on a bottom face of the circuit board 11 and connected to the via conductors 14. The radiating conductors 15 may be formed within the circuit board 11.

As shown in FIG. 3, the circular electrodes 4 are connected to the radiating conductors 15 formed within or on the bottom face of the circuit board 11 through the via conductors 14 formed within the circuit board 11.

The via conductors 14 connect the sealing circular conductors 13 to the radiating conductors 15 for good heat radiation. It is preferred that the via conductors 14 are arranged near the IDT electrode 2 with a large heating value or at an intersection point of a wiring pattern leading from a parallel resonator to a ground with the circular electrode 4, or, when a reflector of the IDT electrode 2 with a large heating value is electrically connected to the circular electrode 4, the connection part, since this arrangement shortens heat radiation path and improves heat radiation effect.

Furthermore, since each circular electrode 4 is formed on the periphery of the piezoelectric substrate 1 in the shape of a square frame, the IDT electrodes 2 and the electrode pads 3 can be effectively arranged within the large area inner from the circular electrode 4.

The larger the diameter of the via conductors 14, the better in terms of heat radiation. However, when the diameter is too large, stress between ceramics as an insulating material of the circuit board 11 and the via conductors 14 formed of metal becomes larger due to the difference between their heat expansion coefficients, thereby generating a break such as crack in an insulating layer near the via conductors 14. This can lower reliability of connection. Thus, the diameter of the via conductors 14 is preferably about 50 to 200 μm.

The radiating electrodes 15 formed within or on the bottom face of the circuit board 11 are connected to an external electronic circuit to ground the SAW apparatus and successfully radiate heat generated with the operation of the IDT electrodes 2 to the outside of the SAW apparatus.

To efficiently release heat generated in the IDT electrodes 2 to the external electronic circuit, each radiating electrode 15 is desirably located so as to be connected to the sealing circular conductor 13 through the shortest path. That is, it is desirable that the radiating electrode 15 is linearly connected to the sealing circular conductor 13 through the via conductor 14.

Furthermore, since the radiating electrodes 15 are main paths for releasing heat generated in the IDT electrodes 2 to the external electronic circuit, it is desirable that the radiating electrode 15 as a connecting face is made larger as far as the design permits.

Thus, heat generated in the IDT electrodes 2 can be diffused through the circular electrodes 4, transmitted from the sealing circular conductors 13 and via conductors 14 connected to the circular electrodes 4 to the radiating electrodes 15 and released from the radiating electrodes 15.

Accordingly, even in the CSP-type SAW apparatus, heat generated in the IDT electrodes 2 of the SAW devices can be radiated successfully. As a result, migration in the IDT electrodes 2 can be prevented from occurring, thereby leading to the SAW apparatus with excellent high power durability.

Each of the electrode pads 3 of the piezoelectric substrate 1 is connected to each input/output via conductor 12 formed on the top face of the circuit board 11 through a circular sealing layer 22 as a conductor bump and each circular electrode 4 is connected to the corresponding sealing circular conductor 13 formed on the top face of the circuit board 11 by using a brazing filler such as solder so as to circularly seal the inside.

Thus, since predetermined space can be ensured on the side of the face where the SAW devices operate to keep hermeticity, the SAW devices can be stably operated without coming under no external influence for a long period, thereby realizing the SAW apparatus with high reliability. Moreover, by filling nitrogen gas as inert gas into the hermitically sealed space, for example, the IDT electrodes 2, electrode pads 3 and input/output via conductors 12 can be effectively prevented from deteriorating due to oxidation and the like. Thus, reliability of the SAW apparatus can be further enhanced.

Further, even when external force is applied to the piezoelectric substrate 1, an adverse effect due to the force can be prevented by receiving the force at the circular electrodes 4 and sealing circular conductors 13, resulting in the SAW apparatus with high reliability.

In this embodiment, the plurality of IDT electrodes 2 and the plurality of electrode pads 3 constitute the transmit filter 5 and the receive filter 6. The circular electrodes 4 each are formed so as to surround the transmit filter 5 and the receive filter 6, respectively. With such a configuration, since the circular electrodes 4 serve as electromagnetic shields with respect to each of the filters 5 and 6, electromagnetic connection between the filters 5 and 6 can be eliminated, thereby suppressing interference between the filters 5 and 6.

Next, materials of the SAW apparatus will be described.

A substrate formed of a piezoelectric material is used as the piezoelectric substrate 1. For example, 36°±3° Y-cut X-propagating lithium tantalate single crystal, 42°±3° Y-cut X-propagating lithium tantalate single crystal, 64°±3° Y-cut X-propagating lithium niobate single crystal, 41°±3° Y-cut X-propagating lithium niobate single crystal or 45°±3° X-cut Z-propagating lithium tetoraborate single crystal can be preferably used as the piezoelectric material since each has a large electromechanical coupling coefficient and a small frequency temperature coefficient. The thickness of the piezoelectric substrate 1 is preferably about 0.1 mm to 0.5 mm. The thickness of less than 0.1 mm makes the piezoelectric substrate 1 fragile and the thickness of more than 0.5 mm necessitates increase in size of the part, making miniaturization of the SAW apparatus difficult.

As materials for the IDT electrodes 2, electrode pads 3 and circular electrodes 4, Al, Al-base alloy, copper, copper alloy, gold, gold alloy, tantalum, tantalum alloy, a laminated film of layers formed of these materials, or a laminated film of a layer formed of any of these materials and a layer formed of a material such as titanium and chromium can be employed. A sputtering method or electron-beam evaporation method can be used as a method of forming a film. Following film formation, a photoresist is spin-coated so as to have a thickness of about 0.5 μm and then patterned into a predetermined electrode pattern by using a stepper. Subsequently, unnecessary part of the resist is melted with alkali developing solution in a developing apparatus, thereby revealing the desired electrode pattern and then the electrodes are etched using an RIE (Reactive Ion Etching) apparatus to obtain the IDT electrodes 2, electrode pads 3, and circular electrodes 4 with the desired electrode pattern.

To obtain desired characteristics of resonator or filter, it is preferred that number of pairs of electrode fingers of the IDT electrodes 2 is 50 to 200, the width of the electrode fingers is 0.1 to 10.0 µm, a space between the electrode fingers is 0.1 to 10.0 µm, the crossing width of the electrode fingers is 10 to 80 µm, and the thickness of the IDT electrodes 2 is 0.2 to 0.4 µm.

In FIG. 3, reference numeral 21 denotes a sealing resin for sealing the SAW devices mounted on the circuit board 11. The sealing resin 21 is a resin formed of epoxy resin, biphenyl resin, polyimide resin or resin containing a filler such as alumina, aluminum nitride and silicon nitride as a solid content. The sealing resin 21 serves as an exterior protective material for protecting the SAW devices mounted on the circuit board 11 against external environment and forces. In this embodiment, the sealing resin 21 is applied over the other principal face of the piezoelectric substrate 1 (top face in FIG. 3) and the top face of the circuit board 11 so as to form an outline of the SAW apparatus. By sealing the SAW devices mounted on the top face of the circuit board 11 with the sealing resin 21 in this manner, it is possible to protect the piezoelectric substrate 1 and electric connection parts against mechanical shock, moisture, chemicals and the like, resulting in the SAW apparatus with high reliability.

The circuit board 11 is prepared by laminating two insulating layers. For example, ceramics containing alumina as a main component, glass ceramics that can be sintered at low temperatures or glass epoxy resin containing an organic material as a main component is used for these insulating layers. When ceramics or glass ceramics is used, the insulating layers are produced as follows: a greensheet is prepared by molding a slurry obtained by uniformly kneading a metal oxide such as ceramics and an organic binder with an organic solvent or the like in the shape of a sheet and a desired conductor pattern or via conductor pattern is formed. Subsequently, the greensheets thus prepared are integrally molded by being laminated and attached to each other and sintered to produce the insulating layers.

On the circuit board 11, a conductor pattern or via conductor pattern for forming desired wiring of the sealing circular electrodes 13, input/output via conductors 12, via conductors 14, and radiating conductors 15 by using metal conductor such as Au, Cu, Ag, Ag—Pd or W are formed and produced according to screen printing, or a combination of a film-forming method such as deposition or sputtering and etching method. If necessary for good connection with the SAW devices, the conductor pattern or via conductor pattern may be Ni or Au plated on the surface thereof.

The conductor bump for connecting the electrode pad 3 to the input/output via conductor 12 is formed of a conductor material such as solder and gold. When using solder, the conductor bump can be formed by applying cream solder at an end part of the electrode pad 3 or input/output via conductor 12 according to screen printing, for example, and then melting the solder. When using gold, the conductor bump can be formed by wire-bonding, for example, a gold wire to the end part of the electrode pad 3 or input/output via conductor 12 and cutting it short. When connection is made using the conductor bump, pressure bonding may be performed while applying heat or ultrasonic waves, thereby ensuring stable and good connection.

Next, another embodiment of the SAW apparatus of the present invention will be described with reference to FIG. 4.

Figure 4:
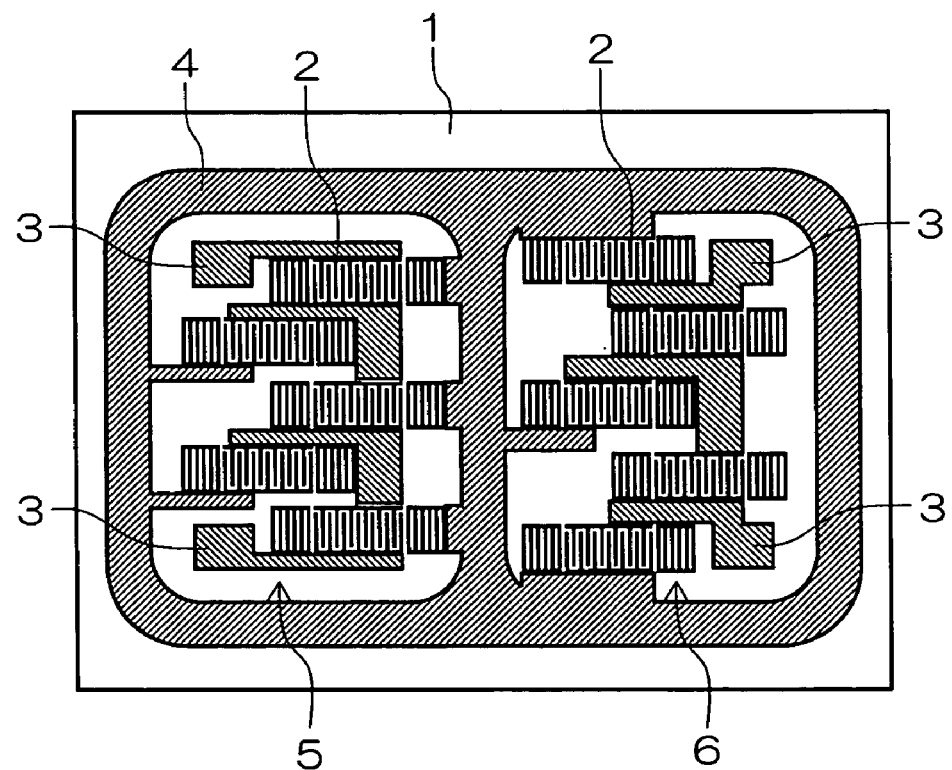
FIG. 4 is a plan view showing a principal face of a piezoelectric substrate on which the circular electrodes surrounding filter devices are jointed to each other.

FIG. 4 is a plan view showing the principal face of the piezoelectric substrate of the SAW devices. In FIG. 4, the same reference numerals are given to similar parts to those in FIG. 1.

In this embodiment, the circular electrode 4 is integrally connected so as to individually surround the transmit filter 5 and receive filter 6.

With such a configuration, as compared with the above-described embodiment, the SAW devices and the SAW apparatus can be further miniaturized while maintaining the equivalent heat radiating property.

Next, still another embodiment of the SAW apparatus of the present invention will be described with reference to FIGS. 5 and 6.

Figure 5:
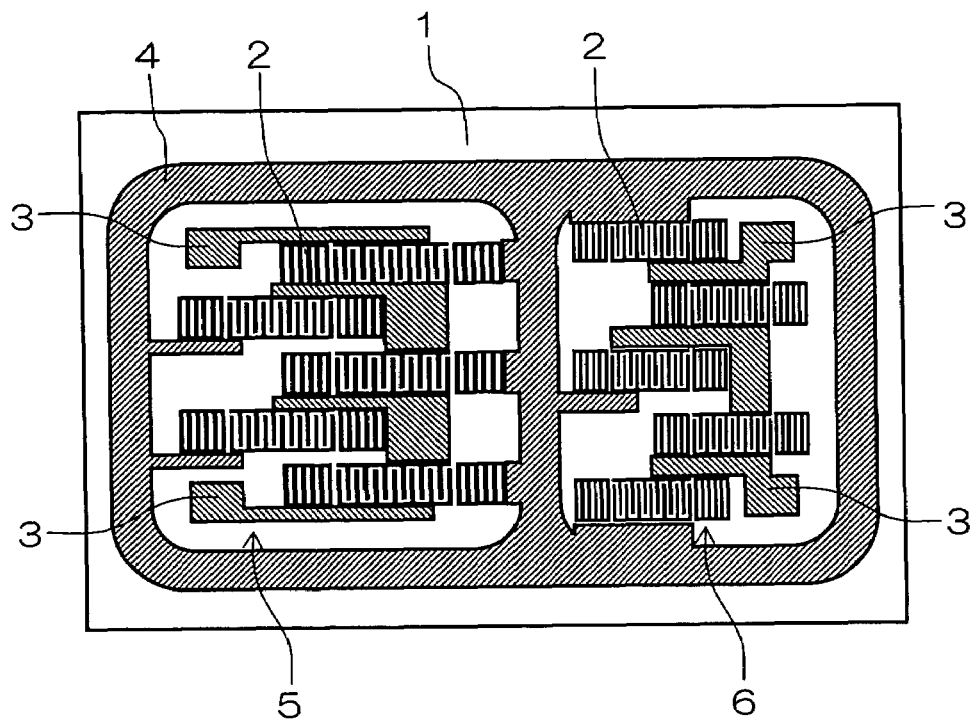
FIG. 5 is a plan view showing a principal face of a piezoelectric substrate on which the circular electrodes surrounding filter devices are different from each other in size.

Similarly to FIG. 1, FIG. 5 is a plan view showing the principal face of the SAW device. Similar to FIG. 2, FIG. 6 is a plan view showing the top face of the circuit board on which the piezoelectric substrate is mounted.

Figure 6:
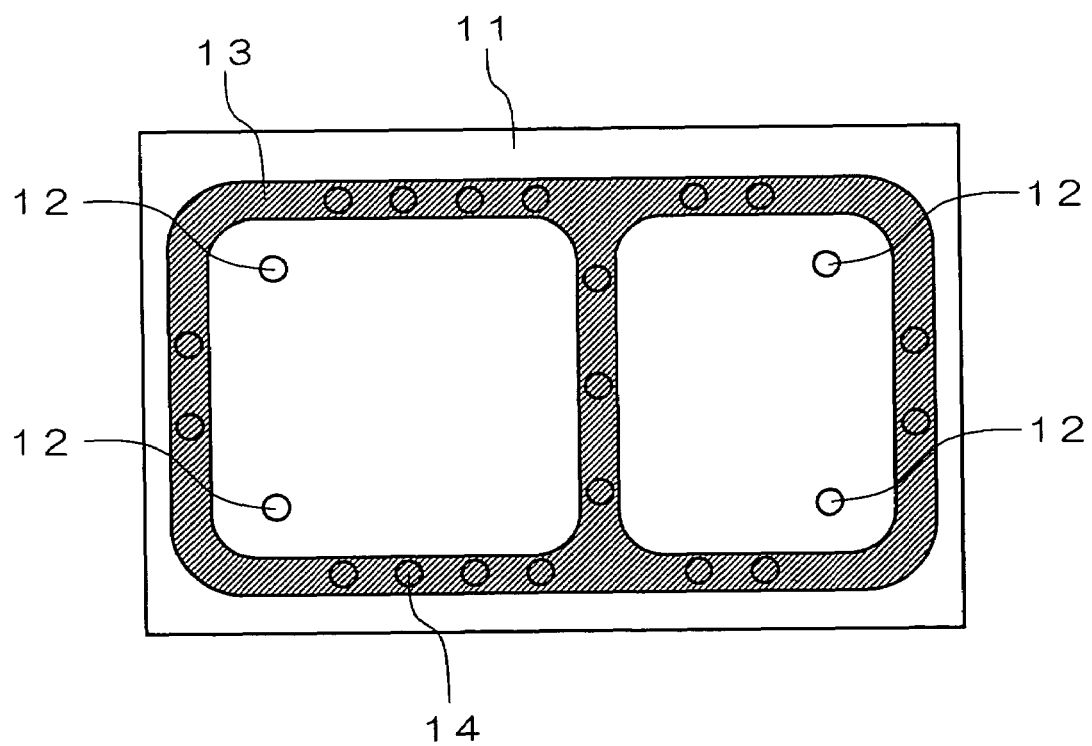
FIG. 6 is a plan view showing a top face of a circuit board on which the piezoelectric substrate is mounted.

In FIGS. 5 and 6, the same reference numerals are given to similar parts to those in FIGS. 1 and 2.

In this embodiment, the circular electrode 4 individually surrounding the transmit filter 5 and receive filter 6 is integrally connected and has different circular parts in size. The transmit filter 5 and receive filter 6 are individually surrounded by the circular parts varying in size. In this embodiment, the area (inner area) of the circular part surrounding the transmit filter 5 is larger than the area of the circular part surrounding the receive filter 6.

With such a configuration, since it is possible to design the IDT electrodes 2 of the transmit filter 5 to which high electric power is applied directly to be larger and provide more via conductors 14 on the periphery of the transmit filter 5 having a larger heating value and connect the conductors 14 to the circular electrode 4, high power durability can be enhanced while suppressing upsizing of the SAW apparatus.

Figure 7:
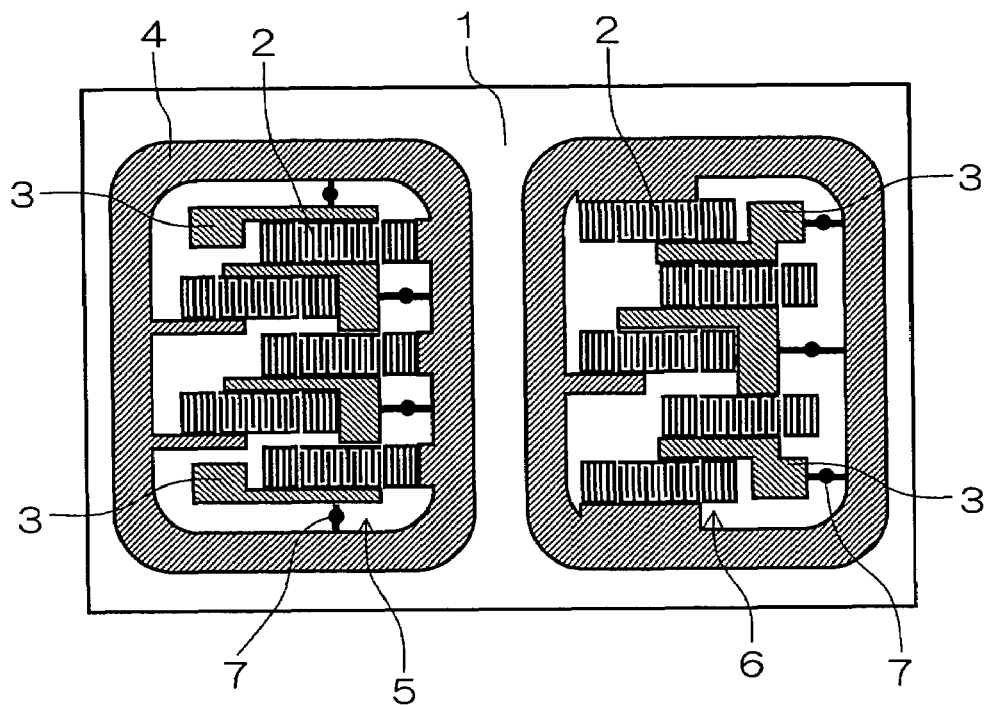
FIG. 7 is a plan view showing a principal face of a piezoelectric substrate on which each IDT electrode is electrically connected to the circular electrode through a resistor.

Next, similarly to FIG. 1, FIG. 7 is a plan view showing the principal face of the piezoelectric substrate of the SAW devices. In FIG. 7, the same reference numerals are given to similar parts to those in FIG. 1.

In this embodiment, the circular electrodes 4 each surround the plurality of filters of transmit filter 5 and receive filter 6 individually and the IDT electrodes 2 connected to a signal line that is not directly connected to the circular electrode 4 among all the IDT electrodes 2 are electrically connected to the circular electrode 4 through resistors 7. Each resistor 7 may be formed of a semiconductor with high resistance such as silicon, titanium oxide, and copper oxide. Alternatively, it may be also formed of a thin-film resistor such as tantalum nitride.

Since the resistors 7 are high impedance with respect to a high-frequency signal input to the IDT electrodes 2, the high-frequency signal never leaks to the circular electrodes 4 through the resistors 7. On the other hand, the resistors 7 are low impedance in direct current, go into conducting state, and serve as paths for radiating heat from the IDT electrodes 2 to the circular electrodes 4. Thus, heat generated in the IDT electrodes 2 can be radiated more efficiently, thereby further enhancing high power durability of the SAW apparatus.

Such resistor 7 may be connected to at least one of the plurality of IDT electrodes 2, more specifically, the IDT electrode 2 with the highest heating value which is not directly connected to the circular electrode 4. The resistor 7 may be connected to the IDT electrode 2 via the signal line in this manner or may be directly connected to a bus bar of the IDT electrode 2.

Next, still another embodiment of the SAW apparatus of the present invention will be described.

Figure 8:
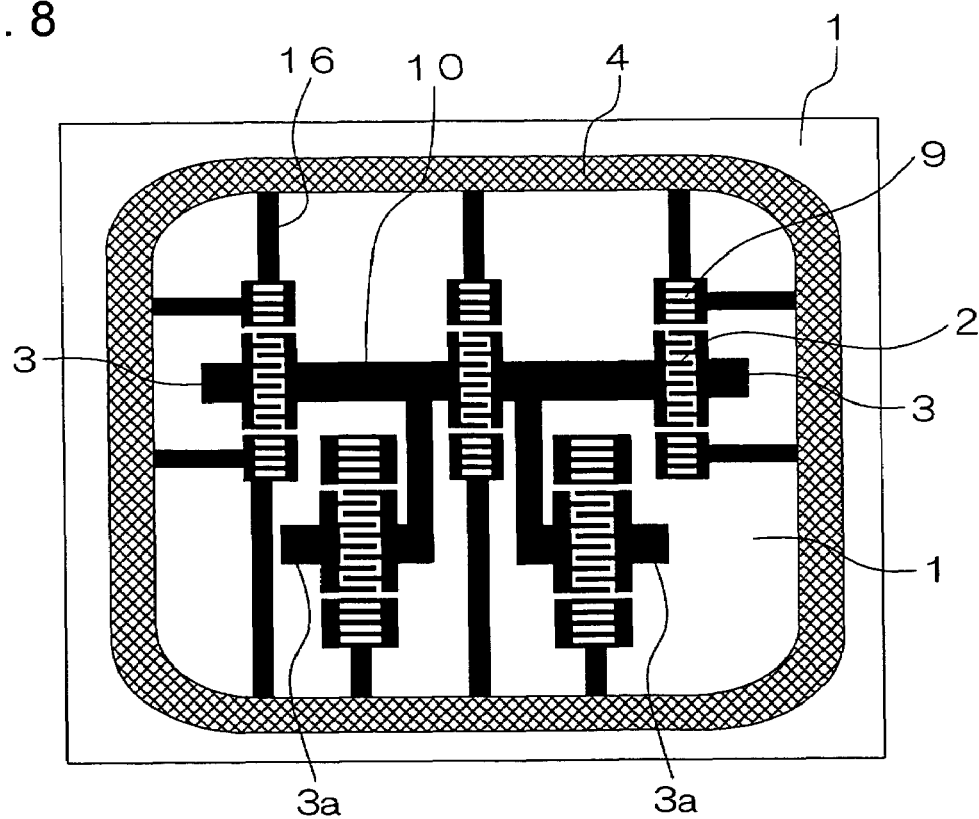
FIG. 8 is a plan view showing a principal face of a piezoelectric substrate on which each reflector is connected to the circular electrode through a connection line.

Similarly to FIG. 1, FIG. 8 is a plan view showing the principal face of the piezoelectric substrate of the SAW device. In FIG. 8, the same reference numerals are given to similar parts to those in FIG. 1.

FIG. 8 shows ground pad electrodes 3a, reflectors 9, wiring electrodes 10 constituting signal lines, and connection lines 16 between the reflectors 9 and circular electrode 4.

As shown in FIG. 8, the reflector 9 is disposed at each side of each IDT electrode 2 in the direction of propagating SAW. The reflectors 9 are connected to the circular electrode 4 through the connection lines 16.

By disposing the reflector 9 at each side of each IDT electrode 2 in the direction of propagating SAW and connecting the reflectors 9 to the circular electrode 4 through the connection lines 16 in this manner, paths for radiating heat generated from the IDT electrodes 2 by receiving an input of high power signal can be ensured at the circular electrode 4 through the reflectors 9 disposed on each side of the IDT electrodes 2.

Therefore, as compared with the apparatus that radiates heat only from the input/output pad electrodes 3 or ground pad electrodes 3a, temperature of the SAW device can be lowered more efficiently. As a result, the SAW device can attain excellent high power durability and high reliability.

Furthermore, when the reflectors 9 are connected to the circular electrode 4 through the connection lines 16 in the process of patterning the IDT electrodes 2, reflectors 9, connection lines 16, and circular electrode 4, advantageously, no new connecting member and complicated process are required.

As shown in FIG. 8, each input/output pad electrode 3 is disposed in the vicinity of the IDT electrode 2 and a dummy pad electrode (not shown) formed of a material with high thermal conductivity such as Pt, Cu, Au or Al is disposed in the vicinity of the IDT electrode 2 in the state where it is not connected to the IDT electrode 2. Thus, the area of the path for radiating heat generated from the IDT electrode 2 can be increased and the SAW device with higher heat radiating property and improved reliability can be realized.

The dummy pad electrode may be patterned in any shape including polygon and elliptic so as to be located in the vicinity of the IDT electrode 2 in the state where it is not electrically connected to the IDT electrode 2. The dummy pad electrode may be formed after formation of the IDT electrode 2 or in the same process by using the same material as the IDT electrode 2.

When the circular electrode 4 is grounded, the reflectors 9 are also connected thereto and thus reflective efficiency of SAW is further increased. Although this mechanism has not been clarified yet, it is guessed that it is due to the following mechanism. That is, conventionally, an electric field slightly occurs at each reflector 9 and therefore, when SAW is reflected, a phase shift may be generated. As a result, a standing wave attenuates due to interference and the reflection coefficient becomes lower than a design value. However, by connecting the reflectors 9 to the ground electrode, it is possible to eliminate the effect of electric field generated at the reflectors 9 and suppress interference with the standing wave generated by the reflectors 9. Thus, reflection coefficient is increased, thereby increasing the reflection efficiency of SAW. Accordingly, by increasing the anti-resonance resistance in the SAW resonator, attenuation outside the passband can be increased.

Figure 9:
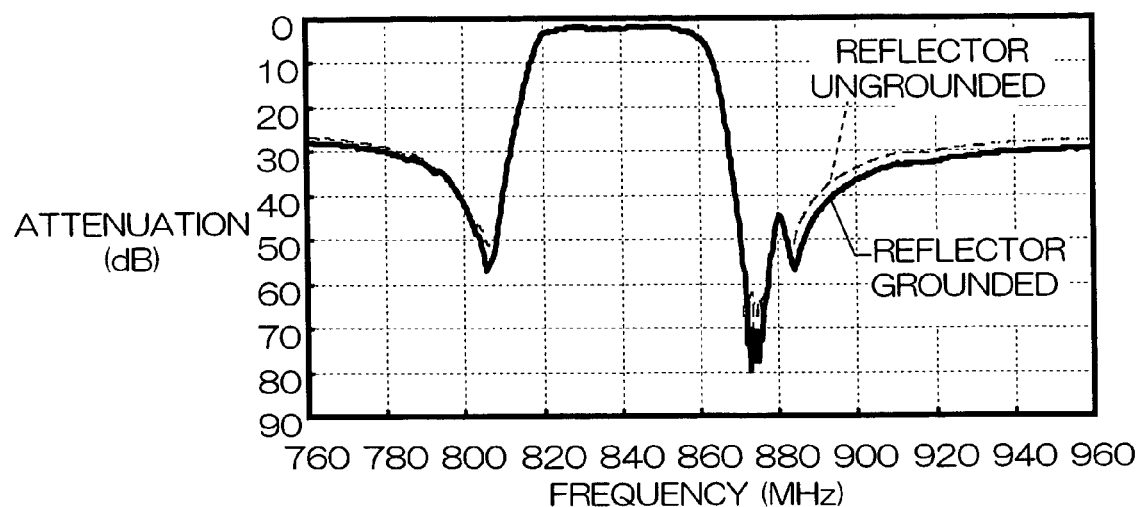
FIG. 9 is a diagram showing the frequency dependency of transmission characteristics of an input signal in the SAW apparatus of the present invention.

FIG. 9 is a diagram showing the frequency dependency of transmission characteristics of an input signal in the case where the SAW apparatus of the present invention is used as a filter. In the figure, a horizontal axis represents frequency (MHz) and a vertical axis represents attenuation (dB) of the input signal. A solid line represents the transmission characteristic in the case where the circular electrode 4 as a ground electrode is connected to the reflectors 9 and a broken line represents the transmission characteristic in the case where the ground circular electrode 4 is not connected to the reflectors 9.

As shown in FIG. 9, it can be confirmed that attenuation outside the passband can be increased by connecting the reflector 9 to the ground circular electrode 4.

In this manner, the path for radiating heat generated from each IDT electrode 2 by receiving input of the high power signal can be set so as to have a large area through the reflectors 9 disposed on each side of the IDT electrode 2 in the direction of propagating SAW, the circular electrode 4, and the sealing circular electrode 13, through not only the conductor bumps connecting the pad electrodes 3 and 3a of the flip-chip mounted piezoelectric substrate 1 to the via conductors 12 of the circuit board 11. For this reason, the temperature of the SAW device can be lowered more efficiently, thereby improving its electric power resistance. As a result, the compact SAW apparatus with high reliability can be realized.

Figure 10:
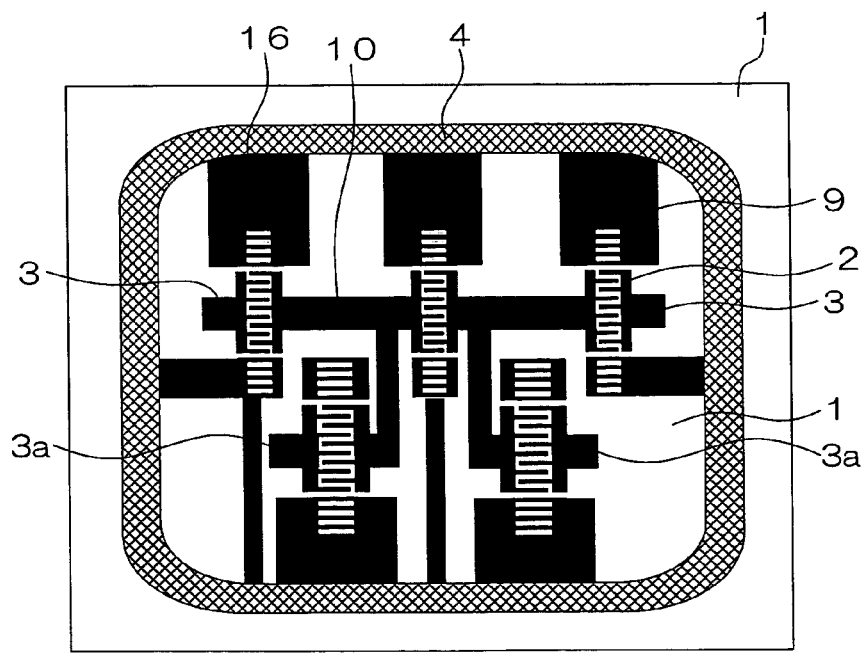
FIG. 10 is a plan view showing a principal face of a piezoelectric substrate on which area of the connection line for connecting the reflectors to the circular electrode is made larger.

FIG. 10 is a plan view showing still another embodiment of the SAW apparatus of the present invention.

In this figure, the width of the connection lines 16 connected to the circular electrode 4 is formed to be larger than that of the SAW device in FIG. 8. Thus, since the area of the path for radiating heat generated from the IDT electrodes 2 by receiving input of the high power signal becomes larger, heat generated in the IDT electrodes 2 can be radiated more effectively, resulting in the SAW device with high reliability.

Next, a communications equipment of the present invention has at least one of a receive circuit having the SAW apparatus of the present invention and a transmit circuit having the SAW apparatus of the present invention.

The communications equipment of the present invention can be obtained by acquiring a band-pass filter by combining the SAW apparatus of the present invention with an inductor, a capacitor and the like, providing the band-pass filter at the receive circuit and the transmit circuit, respectively, and connecting the receive circuit to the transmit circuit by means of a transmit-receive switch apparatus.

The communications equipment of the present invention, by using the compact SAW device having excellent high power durability and high reliability, realizes a small equipment. In this communications equipment, desired filter characteristics can be obtained even when a high power signal is used.

The present invention is not limited to the above-mentioned embodiments and there is no problem in adding various modifications without deviating from the concept of the present invention. For example, although each electrode pad 3 of the piezoelectric substrate 1 is connected to the end part of the input/output via conductor 12 of the circuit board 11 in the above-mentioned embodiments, an electrode pad corresponding to the electrode pad 3 may be formed on the circuit board 11 and connected to the electrode pad 3.

For good isolation between the transmit filter 5 and the receive filter 6, a meander-like phase line and/or matching circuit of an inductor and a capacitor may be arranged. Thus, since the impedance characteristic of the receive filter 6 with respect to an antenna terminal gets close to infinity to the utmost in the transmit frequency band and a transmit signal can be prevented from flowing into the receive filter 6, the isolation characteristic can be improved.

Next, examples of the SAW apparatus of the present invention will be described.

EXAMPLE 1

A 38.7° Y-cut X-propagating lithium tantalate single crystal substrate was used as the piezoelectric substrate. A pattern of the IDT electrodes 2, a pattern of the electrode pads as the input/output electrodes, a pattern of wiring for electrically connecting the electrodes and electrode pads, and the circular electrode, which were formed of Al alloy of Al (99 percent by mass)—Cu (1 percent by mass), were formed on the principal face of the piezoelectric substrate. After preparing these patterns an Al alloy thin film was formed according to the sputtering method as described below, photolithography was performed using a stepper, spin coater, developing apparatus and so on, and then etching was performed using an RIE (Reactive Ion Etching) apparatus to obtain each desired pattern.

First, a lithium tantalate wafer as the piezoelectric substrate was subject to ultrasonic cleaning by use of an organic solvent such as IPA (isopropyl alcohol) to clean organic constituents. Subsequently, the substrate was fully dried in a clean oven and then the IDT electrodes 2, electrode pads, wiring and circular electrode were formed.

In the forming process, after an Al—Cu thin film having the above-mentioned composition was formed using a sputtering apparatus, a photoresist is spin-coated to have a thickness of about 0.5 μm and patterned into each desired pattern by using a stepper. Next, an unnecessary part of the resist is melted in alkali developing solution in a developing apparatus, thereby revealing each desired pattern and then etching of the Al—Cu thin film is performed using the RIE apparatus to obtain the desired IDT electrodes 2, electrode pads 3, wiring and circular electrode.

After that, a protective film for protecting these components was formed. Here, a silicon oxide film was formed by use of the sputtering apparatus, the resist was patterned according to photolithography and windows for input/output electrode part corresponding to the electrode pads and windows for circular electrode part corresponding to the circular electrode were etched by using the RIE apparatus or the like to form a protective film pattern.

Next, an opening pattern of places where the resistors connecting the IDT electrodes to the circular electrode were formed was prepared on the protective film according to photolithography. The places of the protective film were etched by using the RIE apparatus and then the resistors were prepared according to a lift-off method. The resistors were formed using silicon to which boron was added according to the sputtering method.

Although the resistors were prepared independently by means of patterning, the protective film itself may be formed of a semiconductor film of silicon or the like, thereby electrically connecting the IDT electrodes to the circular electrode. In this case, the process of independently preparing the resistors by patterning can be omitted.

Alternatively, in the case of etching the IDT electrodes, an Al—Cu extra-thin film was left between each IDT electrode and the circular electrode, and then, by oxidizing the left Al—Cu extra-thin film in the process of stripping the resist using oxygen plasma or forming the protective film according to a CVD (Chemical Vapor Deposition) method using oxygen plasma, CuAlO2 as a high-resistance semiconductor was formed and used as the resistor.

Furthermore, although the IDT electrode was formed of the Al—Cu thin film of monolayer in this example, a laminated film may be formed by providing a ground layer of Ti, Cu or the like. When Ti, Cu or the like is used as a material for the ground layer, a high-resistance semiconductor such as titanium oxide or copper oxide can be formed by oxidizing the Ti or Cu extra-thin film left in the similar process and the high-resistance semiconductor may be used as the resistor.

Next, the piezoelectric substrate was diced along a dicing line and divided every chip of the SAW device. Subsequently, the electrode pads and circular electrode of the chip were tack-welded to the input/output via conductors and sealing circular conductor of the circuit board with soldering balls and then they were bonded to each other through a reflow process to obtain a SAW device in which the IDT electrodes were sealed hermetically.

Here, the circuit board was prepared by laminating a plurality of insulating layers. For example, ceramics containing alumina as a main component, glass ceramics that can be sintered at low temperatures or glass epoxy resin containing an organic material as a main component was used for these insulating layers. When ceramics or glass ceramics was used, the insulating layers were produced as follows: Greensheets formed of ceramics or the like were prepared and desired wring patterns and via conductors were provided. Subsequently, the greensheets thus prepared are integrally molded by being laminated and attached to each other by pressure and sintered to produce the insulating layers.

In a test of applying electric power of 32 dBm under an environmental temperature of 50° C., the SAW apparatus of the present invention achieved lifetime for high power durability of about 3 hours, which is superior to the conventional SAW apparatus.

From the above-mentioned result, it can be confirmed that the SAW apparatus of the present invention can efficiently radiate heat generated in the IDT electrodes and therefore has excellent high power durability.

EXAMPLE 2

Next, another example of the present invention will be described with reference to FIG. 10.

A 36° Y-cut X-propagating lithium tantalate single crystal substrate was used as the piezoelectric substrate 1. The chip size was set as 1.1 mm×1.5 mm. The IDT electrodes 2 formed of Al—Cu alloy, the input/output pad electrodes 3, the ground pad electrodes 3a, the reflectors 9, the wiring electrodes 10, the connection lines 16, and the circular electrode 4 were formed on the piezoelectric substrate 1 so as to have a thickness of 1800 Å according to the sputtering method, photolithography was performed using a stepper, spin coater, developing apparatus and so on, and then etching was performed using an RIE (Reactive Ion Etching) apparatus to obtain desired patterns.

Next, the piezoelectric substrate was diced along a dicing line and divided every chip of the SAW device.

An LTCC (Low Temperature Co-fired Ceramics) substrate having a size of 70 mm×70 mm and a thickness of 250 μm was used as the circuit board 11.

The via conductors 12 and the sealing circular conductor 13, which are formed of Ag, were formed on the circuit board 11 so as to correspond to the input/output pad electrodes 3 and the circular electrode 4 of the SAW device and have a thickness of about 1 μm.

Soldering paste as the conductor bump and sealing circular layer 22 was applied on the via conductors 12 and the sealing circular conductor 13 according to a screen printing method so as to have a line width of about 100 μm and a thickness of abut 20 μm.

The function face of the chipped SAW device was disposed as opposed to the top face of the circuit board 11 (pattern forming face) so that the pattern comprising the via conductors 12, the conductor bump, the sealing circular conductor 13, and the circular sealing layer of the circuit board 11 might correspond to the input/output pad electrodes 3 and the circular electrode 4. Both were bonded by melting the solder in a reflow furnace at 240° C. for 5 minutes and then hardening the solder.

Subsequently, after the sealing resin 21 formed of epoxy resin was applied so as to cover the SAW device on the circuit board 11 from above the other principal face of the piezoelectric substrate 1 according to a potting method, it was heated in a drying furnace at 150° C. for 5 minutes and hardened. Finally, from the back face of the circuit board 11 at a separating position between the SAW devices, the resin 21 and the circuit board 11 are diced to form the SAW apparatus.

The SAW apparatus thus formed had a size of 1.6 mm×2.0 mm and a height of 0.6 mm. In this manner, the SAW apparatus of the present invention can be produced.

To evaluate heat radiating property of the SAW apparatus of the present invention, the temperature rising from room temperature in each part of the SAW apparatus in the case where a large electric power is applied to the SAW apparatus using the SAW device was obtained by thermal analysis using a finite-element method.

A thermal analysis model of the SAW apparatus in which the reflector 9 was connected to the circular electrode 4, which had the same materials and configuration as the SAW apparatus using the SAW device in the above-mentioned example, was defined as a model (a). For comparison with the present invention, a thermal analysis model of the SAW apparatus in which the reflector 9 is not connected to the circular electrode 4 was defined as a model (b).

Estimation was made provided that the outer circumferential circular electrode exists in both models.

Concerning analysis conditions, the thickness of the piezoelectric substrate 1 was set as 0.25 mm, and for heat conductivity (W/m·K) of each material, the piezoelectric substrate 1 formed of lithium tantalate single crystal was set as 4.1, the circuit board 11 formed of the LTCC substrate as 3.9, the conductor bump and circular sealing layer 22 formed of solder as 61, the sealing resin 21 formed of epoxy resin as 0.5, the IDT electrodes 2 formed of Al—Cu alloy, the input/output pad electrodes 3, the ground pad electrode 4, the reflectors 9, the wiring electrodes 10, the connection lines 16, and the circular electrode 4 as 236, the via conductors 12 and the sealing circular conductor 13 formed of Ag as 150, and air sealed in the oscillating space 14 as $2.6 \times 10^{-2}$.

According to the analysis method, signal power of 0.4 W was input to the SAW apparatus in an atmosphere of room temperature (25° C.), the state where heat generated at or in the vicinity of the IDT electrodes 2 was transmitted to the SAW apparatus and radiated into the atmosphere was simulated, and maximum rising temperature at or in the vicinity of the IDT electrodes 2 and heat resistance ratio during heat transfer from the IDT electrodes 2 to the external atmosphere were calculated. The results are shown in Table 1.

TABLE 1

| Model | Conductor bump material | Thickness of piezoelectric substrate (mm) | Maximum rising temperature (° C.) | Heat resistance ratio (−) |
|---|---|---|---|---|
| (a) | Solder | 0.25 | 58.0 | 0.54 |
| (b) | Solder | 0.25 | 83.2 | 0.96 |

Apparent from the results shown in Table 1, the maximum rising temperature at or in the vicinity of the IDT electrodes 2 was 58.0° C. in the model (a) and 83.2° C. in the model (b) and the heat resistance ratio from the IDT electrodes 2 to the external atmosphere was 0.54 in the model (a) and 0.96 in the model (b).

In the model (a) representing the SAW apparatus of the present invention, compared with the model (b) of the SAW apparatus, the maximum rising temperature at or in the vicinity of the IDT electrodes 2 was lower and the heat resistance ratio was decreased by 60%.

The results revealed that the SAW apparatus of the present invention in which the reflectors 9 disposed near the IDT electrodes 2 were connected to the circular electrode 4 had good heat radiating property.

As described above, since the SAW apparatus of the present invention had good heat radiating property, even when flip-chip mounting was performed, it attained excellent high power durability, thereby achieving reduction in size and high reliability.

What is claimed is:

1. A surface acoustic wave apparatus comprising:
   a filter device including an IDT electrode and an electrode pad which are formed on one principal face of a piezoelectric substrate; and
   a circuit board for mounting the face of the piezoelectric substrate on which the IDT electrode and the electrode pad are formed so as to be opposed to each other;
   a circular electrode surrounding the filter device formed on the face of the piezoelectric substrate on which the IDT electrode and the electrode pad are formed;
   a sealing circular conductor connected to the circular electrode formed on a face of the circuit board on which the piezoelectric substrate is mounted;
   a radiating conductor provided on a face on the opposite side of the face of the circuit board on which the piezoelectric substrate is mounted, or an inside layer of the circuit board; and
   a via conductor which is connected to the sealing circular conductor and passes through the circuit board down to the radiating conductor, wherein a top portion of the via conductor exists, at a top view, within the piezoelectric substrate, and a bottom portion of the via conductor exists, at a top view, within the radiating conductor.

2. A surface acoustic wave apparatus according to claim 1, wherein the sealing circular conductor, the via conductor or the radiating conductor is grounded.

3. A surface acoustic wave apparatus according to claim 1, wherein the circular electrode is formed in the shape of a square frame and the via conductor is connected to any side or all sides of the circular electrode.

4. A surface acoustic wave apparatus according to claim 1, wherein at least one IDT electrode is electrically connected to the circular electrode through a resistor.

5. A surface acoustic wave apparatus according to claim 1, wherein a reflector is disposed at each side of the IDT electrode in the direction of propagating surface acoustic wave and the reflectors are connected to the circular electrode.

6. A communications equipment which is equipped with the surface acoustic wave apparatus according to claim 1 and has at least either of a receive circuit or a transmit circuit.

7. A surface acoustic wave apparatus according to claim 1, wherein the sealing circular conductor and the circular electrode are connected by a sealing layer formed of solder.

8. A surface acoustic wave apparatus comprising:
a plurality of filter devices each including an IDT electrode and an electrode pad which are formed on one principal face of a piezoelectric substrate; and
a circuit board for mounting the face of the piezoelectric substrate on which the IDT electrode and the electrode pad are formed so as to be opposed to each other;
a circular electrode surrounding individually the filter devices formed on the face of the piezoelectric substrate on which the IDT electrode and the electrode pad are formed;
a sealing circular conductor connected to the circular electrode formed on a face of the circuit board on which the piezoelectric substrate is mounted;
a radiating conductor provided on a face on the opposite side of the face of the circuit board on which the piezoelectric substrate is mounted, or an inside layer of the circuit board; and
a via conductor which is connected to the sealing circular conductor and passes through the circuit board down to the radiating conductor.

9. A surface acoustic wave apparatus according to claim 8, wherein the plurality of filter devices are formed of a transmit filter and a receive filter.

10. A surface acoustic wave apparatus according to claim 8, wherein the circular electrodes surrounding the filter devices are connected to each other.

11. A surface acoustic wave apparatus according to claim 8, wherein sizes of the circular electrodes surrounding the filter devices vary from one filter device to another.

12. A surface acoustic wave apparatus according to claim 8, wherein at least one IDT electrode is electrically connected to the circular electrode through a resistor.

13. A surface acoustic wave apparatus according to claim 8, wherein a reflector is disposed at each side of the IDT electrode in the direction of propagating surface acoustic wave and the reflectors are connected to the circular electrode.

14. A communications equipment which is equipped with the surface acoustic wave apparatus according to claim 8, and has at least either of a receive circuit or a transmit circuit.

15. A surface acoustic wave apparatus according to claim 8, wherein the sealing circular conductor and the circular electrode are connected by a sealing layer formed of solder.

* * * * *